United States Patent [19]

Cray

[11] Patent Number: 4,638,188

[45] Date of Patent: Jan. 20, 1987

[54] PHASE MODULATED PULSE LOGIC FOR GALLIUM ARSENIDE

[75] Inventor: Seymour R. Cray, Chippewa Falls, Wis.

[73] Assignee: Cray Research, Inc., Minneapolis, Minn.

[21] Appl. No.: 644,249

[22] Filed: Aug. 27, 1984

[51] Int. Cl.$^4$ .............................................. H03K 17/04
[52] U.S. Cl. ................................... 307/453; 307/443; 307/450; 307/481; 307/514; 307/262; 307/246; 307/269
[58] Field of Search ................. 307/200 B, 442, 443, 307/446, 448, 450, 453, 458, 460, 511, 479–481, 513–514, 516, 581, 582, 262, 246, 269, 353

[56] References Cited

U.S. PATENT DOCUMENTS

| | | | |
|---|---|---|---|
| 3,654,485 | 4/1972 | Lotz | 307/479 |
| 3,656,007 | 4/1972 | Murray | 307/479 X |
| 3,714,460 | 1/1973 | Clemetson et al. | 307/479 X |
| 4,100,430 | 7/1978 | Lesser | 307/479 X |
| 4,190,778 | 2/1980 | Krause | 307/479 X |
| 4,558,235 | 12/1985 | White et al. | 307/450 |

Primary Examiner—John S. Heyman
Assistant Examiner—D. R. Hudspeth
Attorney, Agent, or Firm—Merchant, Gould, Smith, Edell, Welter & Schmidt

[57] ABSTRACT

A logic system preferably for gallium arsenide integrated circuits uses dynamic pulsed logic gates which switch on each clock pulse, with the logical state of an output or data line being indicated by the phase of the pulsed output, which may be shifted or modulated with respect to a reference. An individual logic gate has a first signal generator having a capacitor which is either charged up or discharged during a set-up phase of a clock cycle, depending upon applied input logic signals. During a second, transmit phase of the clock signal, the signal developed on the capacitor is output from the gate. A second signal generator is an inverting slave of the first, and outputs the inverse logic state during the succeeding set-up phase of the first generator. With each gate switching on every clock period, all switching noise appearing in the ground or power supplies is at or above the clock frequency and can simply be filtered out with small chip capacitors, providing improvement in noise immunity. The logic is preferably implemented in gallium arsenide metal oxide semiconductor technology, with the capacitors formed from reverse-biased Schottky diodes, and all FET switches capacitively coupled and self biased.

17 Claims, 6 Drawing Figures

PHASE MODULATED PULSE LOGIC FOR GALLIUM ARSENIDE

FIELD OF THE INVENTION

This invention pertains to the field of electronic digital computers, and specifically to improved high speed electronic logic circuity for computers.

BACKGROUND OF THE PRIOR ART

Increased speed of operation has been a constant design goal in the development of digital computer systems, and efforts toward this goal have proceeded on all levels including improvements in central processor architecture, in input/output systems, and in the electronic logic circuits used. At the electronic logic circuit level, improvements over the years in integrated circuits have produced generations of logic circuits having shorter switching times, pemitting higher clock speed operation in computers. However, as clock speed and computer system complexity increased, other problems were encountered which tended to limit the maximum speed of operation of computers. The problems of ground or power supply noise and the need for greater density to bring circuits physically closer have limited progress in inceasing the speed and size of computers.

The problem of ground noise is very serious, particularly for single ended logic gates which use a single conductor connecting the output of one gate to the input of another gate with the common system signal ground as the return path. In high speed operation, the ground at the circuit module level in the immediate vicinity of the integrated circuits may contain a significant amount of noise induced by the switching on and off of numerous nearby logic gates. This ground noise can cause unintended triggering of other gates, which of course cannot be tolerated and which effectively serves to limit the speed of such systems. It is difficult or impossible to filter out the types of ground noise and power supply noise encountered, since some of it is due to groups of circuits which may switch rather infrequently, i.e. only after a large number of clock pulses, which introduces a low frequency component to the noise which is very difficult to filter out, especially at the chip or module level. A related problem with prior art systems is difficulty in power supply regulation due to surges in demands as groups of devices switch.

Ground return noise can be alleviated by using logic circuits which provide an output and its complement, requiring a pair of conductors to run from each gate to the input or inputs of a succeeding gate or gates. This greatly allevaites the ground return noise problem, although noise introduced through power supplies due to the low frequency component referred to above are still encountered. But the use of logic having a signal and complement creates a density problem, in terms of the number of pins available at the chip or module level, and the circuit board space required for all the conductors. This in turn leads to a physically larger computer with longer than desired path lengths between logic circuits.

A related density problem with present-day designs is the relatively inefficient use of chip and circuit board space because of the need for a great number of latches. Present-day systems, which might be termed loosely synchronous, provide a number of levels of logic between successive latches. Typically eight levels of static logic gates may be interposed between successive clocked latches, although a greater or lesser number may be used. In such systems the clock period must be slow enough to ensure that the logic signals will propagate through the intervening levels of static gates to the next latch in time for the next clock pulse. It would therefore be desirable in terms of shortening the clock period to have more latches with fewer levels of static logic gates between them. However, each latch circuit typically will take up as much space as four or more static logic gates, and their financial cost is also proportionately higher. Therefore a compromise must be made as to numbers of latches and numbers of levels of static logic between them, and the clock period then must be made slow enough to allow for the required settling and propagation time between latches.

SUMMARY OF THE INVENTION

In contrast to the above-described prior art computer logic systems; which might be termed static or direct coupled, loosely synchronous logic, this invention provides dynamic pulsed logic that is tightly synchronous and which provides improvements in terms of operating speed, noise immunity and packing density. According to the logic system provided by this invention, which is advantageously implemented in gallium arsenide metal oxide semiconductor integrated circuits, each logic gate and its output signal are switched on each clock pulse, with the logical state of a signal being evidenced not by a "high" or "low" signal, but instead by the modulation or shifting of the phase of the pulse output signal with reference to the clock signal or some other pulsed reference signal. Logic signals are capacitively coupled to the inputs of gates rather than being direct coupled, which improves noise immunity. Further, since all gates switch at the clock frequency on all clock pulses, the noise present in the ground and power supplies is at the clock frequency with no lower frequency components, and the high clock frequency noise can easily be trapped and filtered by small filtering capacitors at the power pins or individual integrated circuits.

The logic gates of this invention include a pair of signal generators each having a capacitor which is used to hold a signal level during a half cycle of the clock. During a first half period of a clock cycle, termed the set-up phase, the capacitor of the first signal generator is charged or discharged, depending upon logic signals applied to a diode input network which serves to bias a charging path for the capacitor according to the applied input signals. During the second half cycle of the clock period, termed the transmit phase, the signal thus developed on the capacitor is output to the logic output of the gate. Simultaneously the second signal generator develops on its capacitor a signal which is the inverse of the signal previously developed by the first signal generator, and that inverse signal is subsequently output to the logic output of the gate during the set-up phase of the succeeding clock period. In this manner the logic gate switches output during every clock period, but whether the output is "high" or "low" during its transmit phase is a logical function of the applied logic inputs. Thus during operation the gate continues to alternate its output signal between high and low states, but the phase of the pulsing output signal will be modulated, or shifted, with reference to the clock signal, as a logical function of the applied input signals.

According to the logic system of the present invention, no latch circuits in the conventional sense are required, both the latches and intervening levels of static gates of the prior art being replaced by the dynamic pulsing gates of this invention. The clock can be made very fast, since there are no intervening levels of static logic between clocked gates. A disadvantage of this system is the requirement for providing accurate clock signals to each gate, but the advantages of higher speed, noise immunity and greater packing density far outweigh that disadvantage.

A further advantage of the logic system of the present invention is that since each gate switches on every clock pulse, all gates continually operate at a fifty percent (50%) duty cycle, which means that they can be designed physically smaller in terms of power dissipation. With prior art systems, since any particular gate or latch might remain in one state for a long period of time, all circuits had to be designed for one hundred percent (100%) duty cycle operation in terms of power dissipation. The fifty percent (50%) duty cycle operation of this invention results in a further reduction in size.

A related advantage is in terms of simplification of power supply systems for a computer using the logic system of the present invention. Since all circuits switch on every clock pulse, the demands on the power supplies are predictable and uniform, and are not subject to sudden surges as in prior art systems when a large number of gates switch after a period of relative quiet.

DETAILED DESCRIPTION OF THE PREFERRED EMBODIMENT

Figure 1:
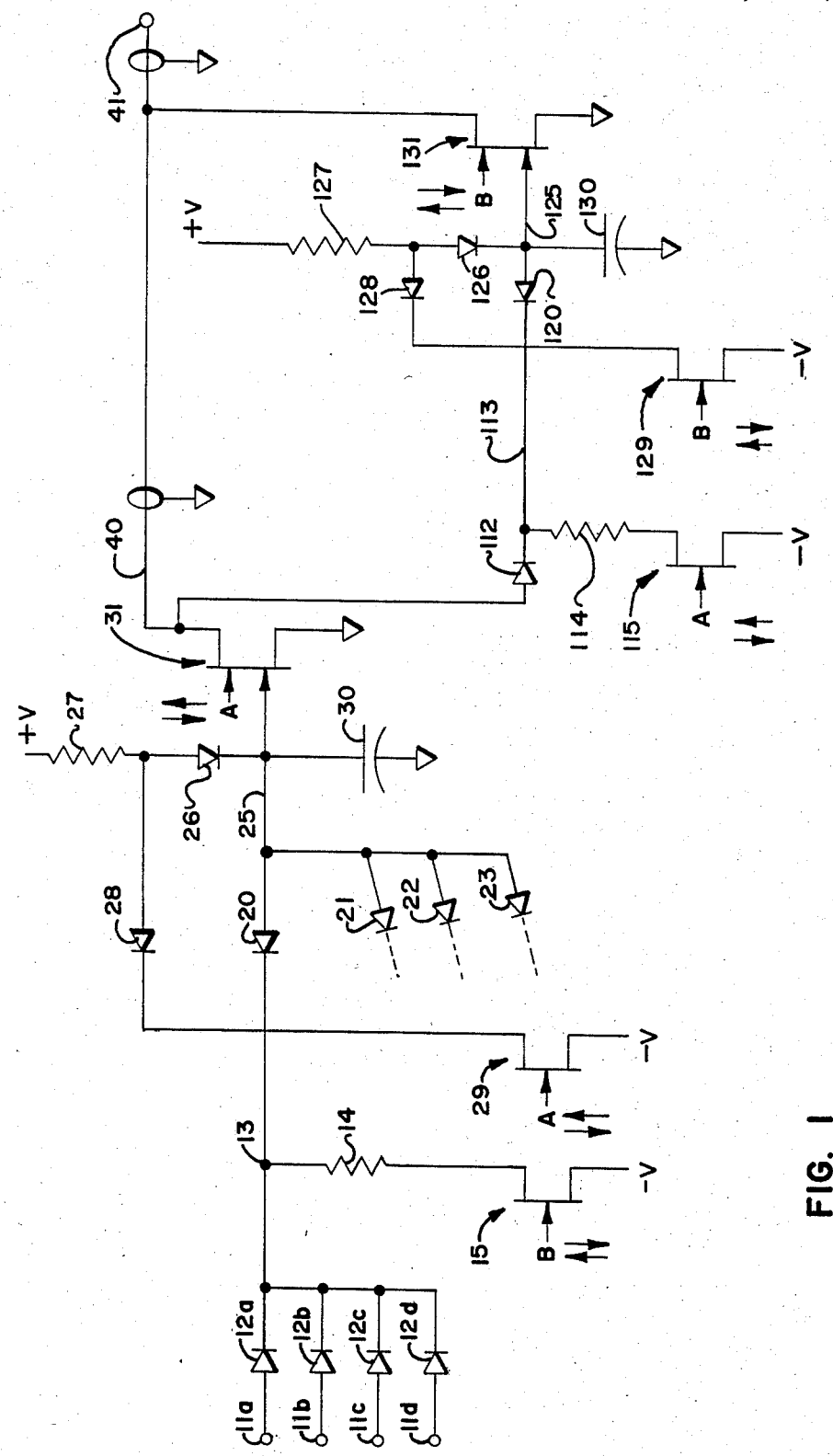
FIG. 1 is a schematic circuit diagram of a logic gate according to the present invention.

Referring now to FIG. 1, a logic gate according to the present invention is shown in schematic form. The preferred form of the invention is of course in integrated circuits, and it will be understood that the use of symbols for discrete components in FIG. 1 is only for purposes of illustration of the operation of the gate.

As illustrated in FIG. 1, the gate has a group of logic inputs, identified by reference numbers 11a through 11d. In addition, although not shown in FIG. 1, additional groups of inputs could be provided as explained more fully hereinafter. Logic input 11a connects to the anode of a diode 12a, whose cathode connects to a conductor 13. In similar manner, logic inputs 11b, 11c and 11d connect through diodes 12b, 12c, 12d, respectively, to conductor 13. A switchable current path is established from conductor 13 to the negative power supply voltage, −V, through resistor 14 and field effect transistor (FET) 15. The source of FET 15 connects to −V, and the drain to resistor 14. A control signal "B", explained further below, is applied to the gate of FET 15.

A capacitor 30 is provided, which is formed as a reverse-biased Schottky diode. One terminal of capacitor 30 connects to signal ground, and the other terminal connects to a conductor indicated by reference number 25. A diode 20 is connected for conducting current from conductor 25 to conductor 13.

Three other diodes, 21, 22 and 23, are indicated in FIG. 1 as having their anodes connected to conductor 25. Although not shown in the drawing, each of these diodes 21–23 can support an additional four inputs and a current path to −V in the same manner that diode 20 supports inputs 11a–11d, along with the current path 14, 15 to −V. These additional inputs and their current paths to −V have been omitted from FIG. 1 for purposes of simplicity of the figure and clarity of explanation.

A current path from +V, the positive voltage power supply, to conductor 25 is established through resistor 27 and diode 26. A further diode 28 connects from the junction of resistor 27 and diode 26 to the drain of an FET switch 29, whose source connects to −V. A control signal "A", explained below, is connected to operate the gate of FET 29.

A branch of conductor 25 is connected to a gate of a further FET 31, whose source connects to signal ground, and whose drain connects to conductor 40. A second gate for FET 31 receives control signal "B". Although drawn as a dual gate FET, FET 31 can be implemented as two FETs connected in series. A branch of conductor 40, which is preferably shielded, connects as the logic output terminal 41.

The circuit thus far described, from logic inputs 11 through FET 41, can be thought of as a first, or phase A, signal generator. A second, or phase B, signal generator is also provided, comprising components 112 through 131. The second signal generator is substantially identical to the first one, and the corresponding components are identified by corresponding reference numbers with a 100 prefix. Thus, diode 112 corresponds to one of the diodes 12, conductor 113 corresponds to conductor 13, etc. Control signal "A" connects to the gate of FET 115, which connects through resistor 114 to conductor 113. Control signal "B" connects to the gate of FET 129, which connects from the cathode of diode 128. Resistor 127 and diode 126 connect in series between +V and conductor 125. The anode of diode 128 connects to the junction between resistor 127 and the anode of diode 126. Capacitor 130 is provided, analogous to capacitor 30 of the first signal generator, and has one terminal connected to signal ground and the other terminal connected to conductor 125. Diode 120 connects from conductor 125 to conductor 113. Dual gate FET 131 has its source connected to signal ground, and its drain connected to a branch of conductor 40 and logic output terminal 41. One gate is controlled by conductor 125, and control signal "A" is applied to the other gate of FET 131.

The control signals A and B are square waves, both having the same period as the clock but having opposite phase to each other so that when A is high B is low and vice verse. During a first phase of a clock period, which is termed the set-up phase, control signal B goes up to turn on FET 15, and control signal A goes down to turn off FET 29. With FET 29 off, the path through diode 28 is cut off, and a current path is established through resistor 27, diode 26, diode 20, resistor 14 and FET 15.

The current path in the preferred embodiment delivers approximately one milliamp through resistor 27 and approximately two milliamps through resistor 14. However, the operation of the current path is altered depending on the data input at terminals 11a–11d. Capacitor 30, which connects to the current path at conductor 25, is either charged up at approximately one milliamp or charged down at approximately one milliamp, depending upon the data input, logic zero or logic one, applied through the inputs to conductor 13.

The charging up or charging down of capacitor 30 takes place during the set-up phase, after which control signal B goes down to turn off FET 15, and control signal A goes up to turn on FET 29. This causes both diodes 20 and 26 to be back biased to isolate capacitor 30 from the current path. If additional input circuits are preset, connecting through diodes 21–23 as described above, they are also back biased by the cutting off of their current paths corresponding to FET 15. During this phase, termed the transmission phase, capacitor 30 is isolated and serves as a memory for the voltage developed in the previous phase. The control gate to FET 31 goes up and the gate is enabled or not, depending on the control voltage existing at capacitor 30.

The phase B generator operates in the same manner described for the phase A generator, but on the opposite half cycle, so that the logic level being output by FET 31 during the transmission phase is applied through input diode 112 to cause capacitor 130 to charge up or down depending on the value being input. At the end of this transmission phase, the next set-up phase begins and the switching of the control signals A and B causes diodes 120 and 126 to be back biased and the value thus developed at capacitor 130 is output through FET 121 to the logic output terminal 41. The process is repeated each clock cycle, with the phase A generator developing a signal during the set-up phase that is a logical function of the applied input signals, then transmitting the developed signal during the transmission phase, while the phase B generator develops the inverse thereof which is applied to the gate output during the set-up phase of the next succeeding cycle. The logic output signal at output 41 thus alternates every clock cycle, but the phase of the signal is modulated, i.e. may be shifted or reversed, as a logical function of the applied logic input signals.

Specifically, it will be noted that the application of input signals through diodes 12a–12d serve a logical AND function at the junction, conductor 13. If more than one such input groups and current paths are provided through diodes 20–23, a logical OR function is provided at the junction of diodes 20–23, at conductor 25. It will be appreciated that these diodes are used for control of the current charging paths anyway, so the AND and OR logic functions in a sense come free without cost of additional components. Not all sixteen inputs may be required for specific applications, and if not needed some can be deleted as permitted by an overall logic design in order to simplify the circuit.

Figure 2:
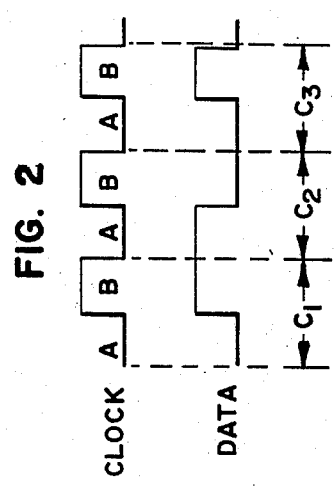
FIG. 2 is a graph of signal waveforms illustrating the operation of the circuit of FIG. 1.

FIG. 2 is a waveform showing the alternating and phase modulated logic signals used by and output from a gate such as that in FIG. 1. Specifically, the upper waveform, identified as "clock", shows an alternating square wave clock signal, having phases marked A and B, a complete cycle of which corresponds to a clock period. Three clock periods are shown, identified as C1, C2, and C3. The second waveform identified as "data" illustrates the modulating, or phase shifting of a waveform to illustrate the two different logic states. During the clock period C1, the data waveform matches the clock waveform, in both A and B phases thereof. During clock period C2, the data waveform has shifted or reversed its phase, so that it is of the opposite phase from the clock waveform. This represents the opposite logic state of the data from what it was in clock interval C1. In clock interval C3, the data waveform has returned to the same logical state as in C1. Thus, it can be seen that while a data stream continues to switch output levels during each clock period, the phase of a data waveform during a clock period may be the same as, or the reverse of, a reference signal to thereby represent the two logical states of the data signal.

As previously mentioned, the preferred implementation of the logic system of the present invention is in gallium arsenide metal oxide semiconductor integrated circuits. This invention is well suited to realize the full potential speed of gallium arsenide devices, which speed cannot be fully realized with loosely synchronous static logic gates for the reasons outlined in the background section above.

All capacitors are formed of Schottky diodes, and care should be exercised to maintain the bias on all Schottky diodes used as capacitors either at a negative voltage, or up to three-fourths of a volt positive. Above that voltage, of course, the diode is forward biased and the desired capacitance effect would be lost. The large capacitor in each cell, corresponding for example to capacitor 30 of FIG. 1, takes up a considerable amount of the available area of an individual logic cell, for example thirty percent (30%).

Figure 3:
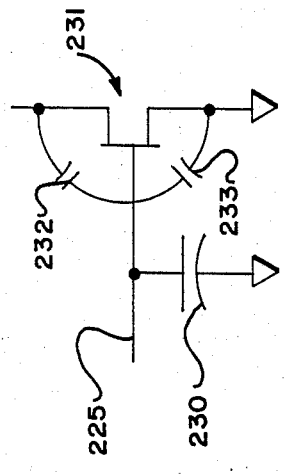
FIG. 3 is a schematic drawing of a portion of the circuit of FIG. 1 illustrating inter-electrode capacitances associated with a FET.

When considering high speed operation of devices it is necessary to consider the effect of interelectrode capacitances. FIG. 3 illustrates a capacitor 230, which would correspond to capacitor 30 of FIG. 1, connected to conductor 225 which is connected to the gate of a FET 231, corresponding to FET 31 of FIG. 1. In addition, inter-electrode capacitances 232 between the drain and gate, and interelectrode capacitance 233 between the gate and source are also shown. These inter-electrode capacitances are inherently present in high speed operation of the device, and are usually considered undesirable as they limit high speed operation. In fact, inter-electrode capacitance 232 should be minimized as it does tend to slow down the operation of the device. However, an advantage of the logic gate of the present invention is that gate-source capacitance 233 is actually helpful. This is because it is in parallel with large capacitor 230, so that the effect of gate-source capacitance 233 is to reduce the amount of space required for capacitor 230. A property of this type of FET, which is used to advantage in this invention, is that gate-source capacitance 233 is present in larger amounts at an approximately four to one ratio over drain-gate capacitance 232. The layout of the FETs such as FET 231 can therefore be made to actually increase inter-electrode capacitance 233 without harm to circuit operation.

Figure 5:
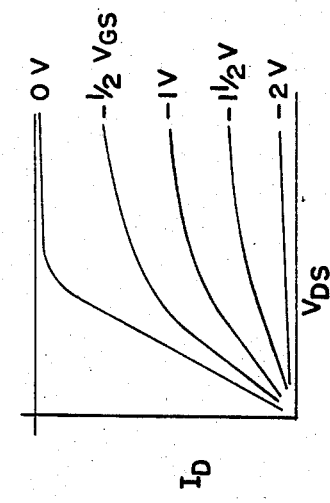
FIG. 5 is a graph of characteristic curves of a FET in the embodiment of FIG. 1.

FIG. 5 shows typical drain current versus drain-source voltage at different gate-source voltages for a typical gallium arsenide FET in the circuit. Signal amplitude and device biasing should be adjusted to switch the gates of FETs between zero volts and the pinch-off voltage, which is approximately $-2$ volts in the example shown. If the voltage applied to a gate exceeds zero volts, it becomes a forward-biased Schottky diode and takes current and clips the waveform. On the other hand, if the voltage fails to go as low as the pinch-off voltage, the FET may not completely cut off the current as desired. To further complicate matters, the pinch-off voltage may well vary for individual FETs across different zones of the integrated circuit due to tolerances and processing variables in the manufacturing process.

Figure 4:
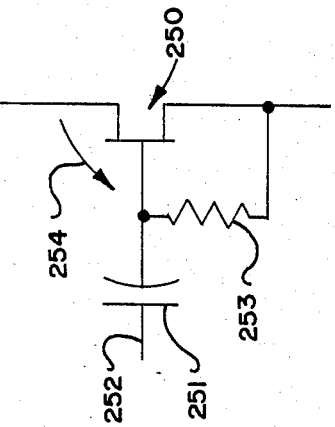
FIG. 4 is a schematic diagram of a portion of the circuit of FIG. 1 illustrating the self biasing of a FET.

For these reasons a self biasing technique is adopted for all FETs. This is suggested in FIG. 4, which shows an individual FET 250. At a microscopic level, each FET has a capacitance 251 at the input to its gate. Thus, all input signals to FETs such as a signal applied at conductor 252, will be capacitively coupled to control the gate of the FET. A large bias resistor 253 is provided between the gate and source of FET 250. In reality, there is always a certain amount of Schottky diode leakage, indicated by arrow 254. This current, passing through resistor 253, and in conjunction with the input capacitance 251, establishes a bias for the gate which automatically adjusts to self regulate for bias level, i.e. −V or ground as the normal state. Further, the self biasing technique always centers the device to compensate for variations in manufacturing tolerances in the characteristic curves for a given FET over the extent of the chip.

Figure 6:
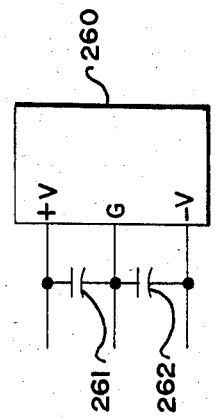
FIG. 6 is a schematic drawing showing the use of filtering capacitors in an integrated circuit using the logic gates of FIG. 1.

As previously mentioned, a logic network or computer using the logic system of the present invention has all logic data lines and gates switching on each clock period, as illustrated in FIG. 2. Thus, all switching noise reflected in the ground or power supplies will be at the clock frequency or higher, but there will be no lower frequency components to the switching noise, as is the case in direct coupled loosely synchronous logic, where a significant group of gates might switch simultaneously after having been quient for a large number of cycles, thus introducing a low frequency component to the switching noise. In the present invention, since the switching noise is all high frequency, it can be simply filtered by chip capacitors as indicated in FIG. 6. In FIG. 6, reference number 260 indicates an integrated circuit using the logic system of the present invention. Small chip capacitors 261 and 262 are connected between the +V and ground, and −V and ground power supply pins, respectively, at the chip level. These chip capacitors filter out the high frequency switching noise that may be present on the power supplies and ground leads, thus preventing unwanted noise from affecting circuit operation. A related advantage of this invention is simplification of power supply regulation problems. Since all circuits switch on every clock cycle, the demand is uniform and predictable and sudden surges are eliminated.

From the foregoing description it will be appreciated that the present invention provides a logic system using phase modulated pulse logic, that takes advantage of the speed potential of gallium arsenide integrated circuit technology, and provides improvements in packing density, speed and noise immunity over prior art logic systems.

What is claimed is:
1. In a gallium arsenide integrated circuit, a plurality of logic gates for use in constructing digital logic networks, each comprising:
a plurality of logic signal inputs, a clock signal input for receiving clock signals having first and second intervals, and a logic signal output;
a capacitance element;
means responsive to said logic signal inputs and to said clock signal input and operative in a first interval of a clock period for charging or discharging said capacitance element depending on the logical state of applied logic signals; and
means responsive to said clock signal input and operative in a second interval of a clock period for transmitting a logic signal to said output having a logical state corresponding to the charged condition developed on said capacitance element.

2. Apparatus according to claim 1, each gate further including a further capacitance element, means operative during said second interval of a clock period for developing a charge on said further capacitance element responsive to the logic signal being transmitted to said output, and means operative in a subsequent clock period interval for transmitting a logic signal to said output based on the charge developed on said further capacitance element and of opposite state from the signal transmitted during said second clock period interval.

3. A logic gate for a gallium arsenide metal oxide semiconductor integrated circuit, comprising:
a plurality of logic inputs;
a logic output;
first and second signal generators, each operative when enabled to develop logic signals in response to logic signals applied thereto, and operative when inhibited to hold the previously developed signal;
means for connecting said logic inputs to said first signal generator and for connecting logic signals developed by said first signal generator to said second signal generator to cause it when enabled to develop a logic signal which is the inverse of the signal developed by said first signal generator; and
switching and control means operatively connected to said signal generators and operative in a first phase to enable said first signal generator to cause it to develop a logic signal that is a function of the applied logic inputs and to inhibit said second signal generator to cause it to output to the logic output a previously developed signal, and operative in a second phase to inhibit said first signal generator to cause it to output to the logic output its signal developed in the immediately preceding phase and to enable said second signal generator to cause it to develop a signal which is the inverse of the signal of the first generator.

4. In an electronic logic network:
a plurality of binary logic gates, each having a plurality of logic inputs and a logic output;
means for applying clock pulses to each of said logic gates;
each of said logic gates operative to produce pulsed output logic signals which alternate between high and low output states synchronously with said clock pulses and operative to selectively modulate the phase of said pulsed output logic signals as a logical function of signals applied to its logic inputs; and
means for connecting the outputs of selected ones of said logic gates to inputs of selected ones of said logic gates according to a logic function to be performed by said network.

5. A logic network according to claim 4 wherein said clock pulses comprise a plurality of clock periods each consisting of two phases of substantially equal duration, and wherein each of said logic gates includes means responsive during a first phase of a clock period to develop an output logic signal having a logic state responsive to logic signals applied to said inputs during said first phase, and means for transmitting said developed logic output signal to its output during the second phase of a clock period.

6. A logic network according to claim 5 wherein each logic gate includes means for transmitting an output signal from its logic output during the first phase of a clock period which is the inverse of the output signal transmitted by the gate in the second phase of the preceding clock period.

7. In a gallium arsenide metal oxide semiconductor integrated circuit, a logic gate comprising:
   a capacitor element;
   current control means connected to said capacitor and operative when enabled to permit charging or discharging of said capacitor;
   logic input means connected to said current control means for applying input logic signals thereto to cause charging or discharging of said capacitor depending upon the logical state of the applied logic signals;
   logic output means connected to said capacitor and operative when enabled to provide a logic output signal having a state dependent on the charge or discharge condition of said capacitor; and
   clock phase switching means operatively connected for enabling said current control means and inhibiting said logic output means during a first clock phase, and inhibiting said current control means and enabling said logic output means during a second clock phase, so that a logic signal developed on said capacitor during the first phase in response to applied input signals is output in the second phase.

8. An integrated circuit according to claim 7 wherein said capacitor element comprises a reverse-biased Schottky diode.

9. An integrated circuit according to claim 7 wherein said clock phase switching means includes field effect transistor connector for controlling said current control means and said logic output means in response to clock signals.

10. In a gallium arsenide metal oxide semiconductor integrated circuit, a logic gate comprising:
    a capacitor formed as a reverse-biased Schottky diode;
    a charging circuit for providing when enabled a current path for charging or discharging said capacitor;
    input logic means for receiving logic signals, said input logic means connected to said charging circuit and operative to alter the operation thereof to charge or discharge the capacitor depending upon the logical state of the applied logic input signals;
    clock phase switching means connected to said charging circuit and operative in a first clock phase period to enable said charging circuit to charge or discharge said capacitor, and operative in a second succeeding clock phase to inhibit said charging circuit from altering the charge on said capacitor;
    first logic means operatively connected to said capacitor and said clock phase switching means for providing a first logic signal during said second clock phase corresponding to the charge developed on said capacitor during the preceding first clock phase; and
    second logic means operatively connected to said first logic means for developing, during said second clock phase for output during a subsequent clock phase, a second logic signal which is the inverse of said first logic signal.

11. A logic gate according to claim 10 wherein said second logic means includes a second capacitor, a charging circuit for providing charging current to said second capacitor, means for applying said first logic signal from said first logic means to said second logic means to control the charging or discharging of said second capacitor during said second clock phase depending on the logic state of said first logic signal, and means operative in the first clock phase of the next succeeding clock period to output said second logic signal corresponding to the charge on said second capacitor and of opposite logical state to said first logic signal.

12. A logic gate according to claim 10 wherein said charging circuit includes a bias current path from a positive power source through an isolation diode to said capacitor through a further isolation diode and a switching element to a negative power source, and wherein said input logic means connects through a diode network to the bias path to alter the current flowing therein so that current flows to charge the capacitor or discharge the capacitor depending upon the logic state of the received logic signals, and wherein said clock phase switching means includes a further switching element connecting through a diode to said current path so that said switching elements can be switched to reverse bias said isolation diodes to inhibit the charging circuit and cause the previously developed charge on said capacitor to be held.

13. A logic gate according to claim 12 wherein said first logic means includes a switching element enabled by said clock phase switching means and controlled by the charge on said capacitor to switch said first logic signal.

14. In a gallium arsenide metal oxide semiconductor integrated circuit, a logic gate comprising:
    a logic output;
    a group of logic inputs;
    diodes connecting from each of said logic inputs to an input summing point;
    means defining a current path from said input summing point through a resistance and a switching FET to a source of negative potential;
    a first capacitor, comprising a reverse-biased Schottky diode;
    means defining a current path from a source of positive potential through a resistance and an isolation diode to said first capacitor;
    a second isolation diode connecting from said capacitor to said input summing point to provide a current path for discharge of said capacitor;
    a second switching FET connected to a source of negative potential, and connecting through a diode for selectively reverse biasing said first isolation diode;
    first output switching FET means connected to said logic output and having a gate connected to said first capacitance for control by the charge thereon, said first output switching FET means including a series switching element for control by a timing signal;
    inverting signal generator means including a second capacitance and means connected thereto and to said logic output and operative when enabled to developing a charge on said second capacitor of opposite logic state of the charge of said first capacitor;

second output switching FET means connected to said logic output and having a gate connected to said second capacitor for control by the charge thereon, said second output switching FET means including a series switching element for control by a timing signal; and timing and control signal means connected for controlling said first and second switching FETs, said inverting signal generating means, and said series switching elements of said first and second output switching FET means, said timing and control signal means operative in a first phase to enable the current paths to said first capacitor and to enable said second logic output switching FET means, and operative in a second succeeding phase to enable said first output switching FET means and said inverting signal generating means.

15. A logic gate according to claim 14, including a further group of logic inputs, diodes connecting from each of the logic inputs of said further group to a further input summing point, a further isolation diode connecting from said capacitor to said further input summing point, means defining a current path from said further input summing point through a resistance and switching FET to a source of negative potential, and means for applying said timing and control signals thereto to enable said further group of logic inputs and current path during said first phase, whereby the charging of said capacitor is controlled as a logical OR function by the groups of inputs.

16. In a gallium arsenide metal oxide semiconductor integrated circuit, a logic gate comprising:

a group of logic inputs and a logic output;

first and second signal generators, each comprising;

a capacitor formed as a reverse-biased Schottky diode;

a charging circuit connected from a source of positive potential through a resistance and through an isolation diode to said capacitor;

a mode switching diode connected from said isolation diode through a FET switch to a source of negative potential, and operative when said FET switch is turned on to back bias said isolation diode;

discharge control circuit means connected to said capacitor and including a second isolation diode connected from said capacitor to a signal generator input point and a resistor connected from said input point through a further FET switch to a source of negative potential;

an output switching FET means having a first gate element connected for control by the voltage signal on said capacitor and having a second gate element for control by a timing signal for selectively enabling or inhibiting said output switching FET means;

input diodes connecting from each of said logic inputs to said input point of said first signal generator for control of said discharge control circuit as a function of applied input logic signals;

means connecting the output switching FET means of both of said first and second signal generators to the logic output of said gate;

means including a diode connecting the logic output of said gate to the input point of said second signal generator; and timing and control means for applying control signals to said first and second FET switches of said signal generators and to said second gate means of said first and second signal generators and operative in a set-up phase to enable the charging circuit and discharge control circuit of said first signal generator so that said capacitor will be charged or discharged according to applied logic inputs, and to inhibit its output switching FET means, and applied to said second signal generating means to inhibit its charging circuit and discharge control circuits and to enable its output switching FET means, and operative in a second transmit phase to reverse the said inhibit and enable conditions of the set-up phase, whereby said first signal generator is caused to develop a logic signal during the set-up phase according to applied logic inputs and to transmit said developed signal during the transmit phase, while the second signal generator outputs the inverse logic state during the subsequent set-up phase.

17. A logic gate according to claim 16 wherein said first signal generator comprises a further discharge control circuit comprising a further isolation diode connected from said capacitor to a further input point and a further resistor connecting from said further input point through a further FET switch to a source of negative potential, and including a further group of logic inputs and diodes connecting them to said further input point of said further discharge control circuit, whereby a logical OR function between the two groups of inputs is provided at the connection to said capacitor.

* * * * *